Figure 1:
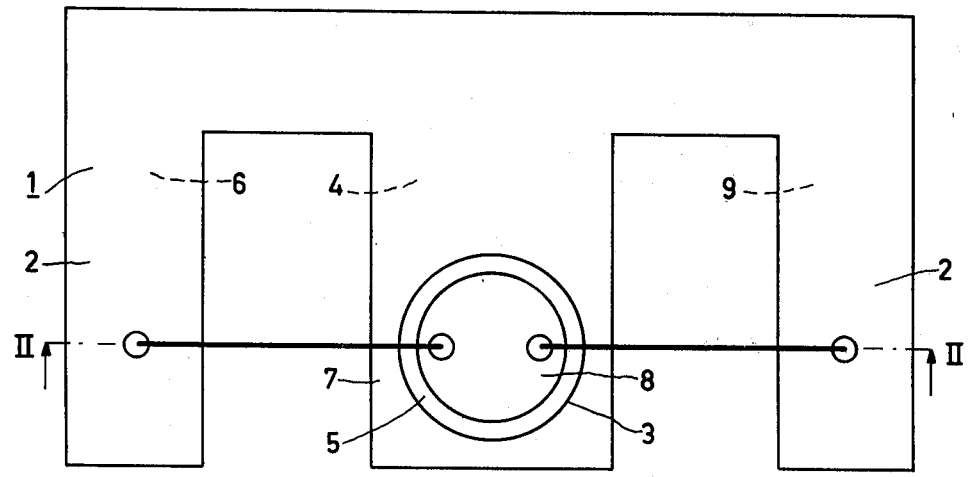

United States Patent [19]

Mikkers et al.

[11] 4,441,964
[45] Apr. 10, 1984

[54] METHOD OF DEPOSITING A METAL

[75] Inventors: Franciscus E. P. Mikkers; Peter E. Wierenga, both of Eindhoven, Netherlands

[73] Assignee: U.S. Philips Corporation, New York, N.Y.

[21] Appl. No.: 459,859

[22] Filed: Jan. 21, 1983

[30] Foreign Application Priority Data

Feb. 15, 1982 [NL] Netherlands .................. 8200561

[51] Int. Cl.³ .............................................. C25D 5/02
[52] U.S. Cl. ................................................. 204/15
[58] Field of Search .......................................... 204/15

[56] References Cited

U.S. PATENT DOCUMENTS 4,217,183 8/1980 Melcher .......................... 204/15

Primary Examiner—T. M. Tufariello
Attorney, Agent, or Firm—Norman N. Spain

[57] ABSTRACT

The invention relates to a method of depositing a metal on a heat-conducting substrate, in which a surface (2) of the substrate is irradiated at at least one area (3) in a bath by a laser beam and the metal is deposited from the bath at that area (3) on the substrate (1).

In order to improve the localization of the deposited metal at the irradiated area and in its immediate surroundings, according to the invention, the metal is deposited on a layer (7) of the substrate (1) located at least at the irradiated area (3) and in its non-irradiated surroundings.

The layer (7) has a heat conduction coefficient which is smaller than the heat conduction coefficient of the material of the substrate (1) adjoining the layer (7).

6 Claims, 3 Drawing Figures

METHOD OF DEPOSITING A METAL

The invention relates to a method of depositing a metal on a heat-conducting metallic substrate, in which a surface of the substrate is irradiated at at least one area in a metal deposition bath by a laser beam and the metal is deposited from the bath at that area on the substrate.

In the known technique, methods are frequently used in which substrates are provided with metal layers. In this case the aim is to completely or partly coat a substrate surface. When a substrate surface is to be partly coated, use is made, for example, of a masking of the substrate surface, as a result of which parts of this surface to be coated with metal are left exposed. Metal may also be deposited on the whole substrate surface and then be removed from areas at which the metal is not desired, for example, by means of a suitable masking technique.

When partially coating substrate surfaces, a serious problem is the cost involved. Both when applying and when removing the metal with the use of a mask, metal is applied over a comparatively large surface area, as a result of which metal often is deposited at areas at which it is not desired. Moreover, the usual masking techniques often are laborious and time-consuming.

It is known (see Appl. Phys. Letters Vol. 35, pages 651-653 (1979), while avoiding masking techniques, to deposit metal by electroplating on a heat insulating-substrate at areas which are irradiated by a laser beam and in the immediate vicinity of these areas. The local metallization probably is linked with local heat development by irradiation with the laser beam.

However, it is of importance that, while avoiding masking techniques, it also becomes possible to locally deposit, for example by electroplating, metal on a heat conducting substrate. Such a technique is of importance, for example, to make it possible to secure a semiconductor body on a heat-absorbing substrate (so-called heat sink).

It is stated in the aforementioned article that metal is deposited on a metallic substrate at the area at which this substrate is irradiated by a laser beam.

Experiments which have led to the invention have shown that the metal is deposited also outside the irradiated areas and their immediate surroundings in a thickness which decreases with the distance from the irradiated area so that a desired limitation of the deposit cannot be obtained readily.

The invention has inter alia for its object to improve at least to a considerable extent the homogeneity of the thickness and the limitation of the area of the metal deposit.

The invention is based inter alia on the recognition of the fact that the lack of selectivity is probably linked up with the often high thermal conductivity of substrates used, as a result of which the effect of the laser beam strongly increases from the irradiated area to the non-irradiated surroundings of that area.

The method mentioned in the preamble therefore, characterized according to the invention is in that the metal is deposited on a layer of the substrate which is located at least at the irradiated area and in its non-irradiated surroundings and has a thermal conductivity which is smaller than the thermal conductivity of the metal of the substrate adjoining the layer.

In the method according to the invention, the deposition of metal is limited to those areas which are irradiated by the laser beam and to their immediate surroundings, while the metal deposit has a substantially homogeneous thickness and is thus limited.

The method according to the invention may be carried out by an electroless process, but the metal is preferably deposited by electroplating.

Particularly satisfactory results as to the selectively of the area of deposition are obtained if the ratio between the thermal conductivities of the materials of the layer and of the adjoining substrate is smaller than the ratio between the thickness of the layer and the diameter of the laser beam.

The substrate is preferably chosen to be flat and the layer extends at least along one main surface of the substrate.

In general, such a substrate can be manufactured in a simple manner, while moreover the layer can then be used elsewhere on the substrate advantageously in another processing step, in which a local heat treatment has to be carried out.

In case the use of the substrate for semiconductor devices requires it to act as a "heat sink", use is often made of copper or copper-containing alloys, for example, copper-zinc, copper-tin and copper-zirconium alloys. Such materials have a high heat conduction coefficient and without further steps being taken, they are particularly unsuitable for use in a method of selective coating by means of a laser beam.

Preferably, the layer is obtained by deposition of a material chosen from the group consisting of cobalt-phosphorus and nickel-phosphorus alloys, nickel-boron alloys and titanium nitride. Thus, satisfactory results are obtained as to, for example, the application of metallization regions necessary for semiconductor devices, while the heat sink effect of the substrate is not adversely affected.

Preferably, the metal deposited is gold. This deposition takes place, for example, on a nickel-phosphorus alloy layer. The selective gold deposit may then be used, for example, for soldering of a semiconductor body consisting, for example, of silicon, while elsewhere on the substrate the nickel-phosphorus alloy layer may be used for external connections to parts of the semiconductor body by aluminum bonding.

The invention will now be described with reference to an example and the accompanying drawing.

Figure 2:
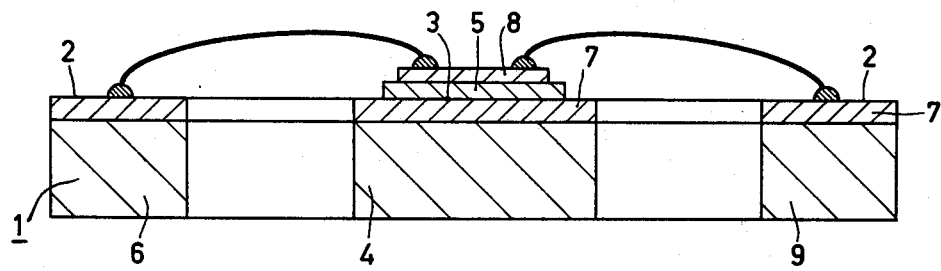
Figure 3:
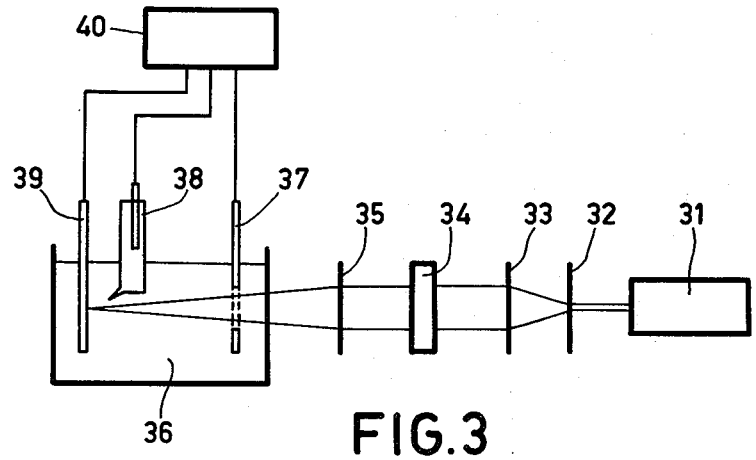

In the drawing,

FIG. 1 shows diagrammatically an elevation of a part of a semiconductor device in a stage of manufacture by means of the method according to the invention, FIG. 2 shows diagrammatically a cross-section taken on the line II—II in FIG. 1 of the semiconductor device at this stage, and FIG. 3 shows diagrammatically an arrangement for carrying out the method according to the invention.

In the manufacture of the semiconductor device chosen by way of example, the starting member is a heat-conducting substrate 1. A surface 2 of the substrate 1 is irradiated at an area 3 in a bath by a laser beam, metal being deposited from the bath at the area 3 on the substrate 1.

The metal deposit obtained is designated by the reference numeral 5.

According to the invention, the metal is deposited on a layer 7 of the substrate 1 which is located at least at the irradiated area 3 and in its non-irradiated surroundings, this layer 7 having a thermal conductivity which is smaller than the thermal conductivity of the material of the substrate 1 adjoining the layer 7.

By means of the method according to the invention, it is ensured that the metal deposit 5 is substantially limited to the area 3 irradiated by the laser and to its immediate surroundings, which, for example, in case gold is selectively deposited, may lead to considerable savings in cost.

Preferably, the starting member is a flat, for example, comb-shaped substrate having a thickness of 0.4 mm and teeth 4, 6 and 9, while the layer 7 extends over the whole top surface of the substrate.

For the substrate, use is preferably made of a copper-zinc alloy having a composition of, for example, 85% by weight of copper and 15% by weight of zinc. This material has a thermal conductivity of approximately 0.38 cal/cm.sec.K (159, 1 w/mk) at a temperature of 20° C.

Preferably, the layer 7 is obtained in a usual manner by which a nickel-phosphorus alloy layer is deposited by electroplating or by an electroless process. The material of this layer has a heat conduction coefficient of approximately 0.01 cal/cm.sec.K (4, 2 w/mk) at a temperature of 20° C. The layer has a thickness of, for example, 4 $\mu$m.

The metal deposit 5 is obtained by electrodeposition (see FIG. 3) from a gold bath 36 having, for example, the composition: potassium gold cyanide KAu(CN)$_2$ 100 g/l and citric acid C$_6$H$_8$O$_7$ 100 g/l, the pH value of which bath is adjusted to 5.6 by means of KOH.

The voltage required for the deposition is supplied by a potentiostatic voltage source 40, by means of which the voltage between the substrate connected as a cathode 39 and the reference electrode 38 is constantly kept at 800 mV by regulating the voltage between the cathode 39 and a gold anode 37. The area of the substrate to be irradiated is irradiated by a 20 W argon laser 31 through an optical lens system 32,33,35 and a shutter 34. At the area of the cathode the laser beam has a diameter of 100 $\mu$m. The deposition rate is approximately 2 $\mu$m/sec.

In the example described, the ratio between the thermal conductivity of the materials of the layer 7 and that of the adjoining substrate is 1/38, which is considerably less than the ratio between the thickness of the layer and the diameter of the laser beam, which is 1/25.

The metal deposit 5 has, for example, a circular shape of 300 $\mu$m in diameter, has a thickness of 4 $\mu$m and consists of gold. A semiconductor body 8 of approximately the same size and, as the case may be, having a surface provided with a gold layer may be secured in a usual manner by soldering on the metal deposit 5.

In case a circuit element, for example, a transistor, has been formed already in the semiconductor body the substrate 1 is used for contacting and heat dissipation from the semiconductor body 8. Contact areas already present on the semiconductor body can be connected by aluminum bonding to the layer 7 at the teeth 6 and 9, while, after the semiconductor device has been arranged in an envelope, the teeth 4, 6 and 9 are disconnected and serve for external contacting of the semiconductor device.

The method according to the invention is not limited to the example given, but may be modified in many ways within the scope of the invention. Instead of of gold, for example, platinum or iridium may be deposited as the metal.

What is claimed is:

1. A method of depositing a metal on a heat-conducting metallic substrate, in which a surface of the substrate is irradiated at at least one area by a laser beam, while said metallic substrate is in a metal deposition bath and the metal is deposited from the bath on said irradiated surface on the substrate, characterized in that the metal is deposited on a layer of the substrate which is located at the irradiated area and in its non-irradiated surroundings and has a thermal conductivity which is smaller than the thermal conductivity of the metal of the substrate adjoining the layer, the ratio between the thermal conductivity of the material of said layer and that of the adjoining substrate being smaller than ratio between the thickness of said layer and the diameter of said laser beam.

2. A method as claimed in claim 1, characterized in that the metal is deposited by electroplating.

3. A method as claimed in claims 2 or 1, characterized in that the substrate is chosen to be flat and the layer extends at least over one main surface of the substrate.

4. A method as claimed in claims 2, 3 or 1, characterized in that the material used for the substrate consists of copper or copper alloys.

5. A method as claimed in claims 2, 3, 4 or 1, characterized in that the layer is obtained by deposition of a material chosen from the group consisting of cobalt-phosphorus and nickel-phosphorus alloys, nickel-boron alloys and titanium nitride.

6. A method as claimed in claims 2, 3, 4, 5 or 1, characterized in that the metal deposited is gold.

* * * * *

UNITED STATES PATENT AND TRADEMARK OFFICE
CERTIFICATE OF CORRECTION

PATENT NO. : 4,441,964
DATED : April 10, 1984
INVENTOR(S) : FRANCISCUS E.P. MIKKERS ET AL It is certified that error appears in the above—identified patent and that said Letters Patent is hereby corrected as shown below:

Column 4, Line 31, after "than" insert --the--.

Line 37, cancel "chosen to be".

Line 39, cancel ",3".

Line 42, cancel ",3,4".

Line 47, cancel ",3,4,5".

Signed and Sealed this

Fourteenth Day of August 1984

|SEAL|

Attest:

GERALD J. MOSSINGHOFF

Attesting Officer

Commissioner of Patents and Trademarks